(12) United States Patent
Mallela et al.

(10) Patent No.: US 9,337,334 B2
(45) Date of Patent: May 10, 2016

(54) SEMICONDUCTOR MEMORY DEVICE EMPLOYING A FERROMAGNETIC GATE

(71) Applicant: GLOBALFOUNDRIES INC., Grand Cayman (KY)

(72) Inventors: Hari V. Mallela, Poughquag, NY (US); Edward J. Nowak, Essex Junction, VT (US); Yunsheng Song, Poughkeepsie, NY (US); Reinaldo A. Vega, Wappingers Falls, NY (US); Keith Kwong Hon Wong, Wappingers Falls, NY (US); Zhijian Yang, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/257,395

(22) Filed: Apr. 21, 2014

(65) Prior Publication Data

US 2015/0303313 A1 Oct. 22, 2015

(51) Int. Cl.
*H01L 21/02* (2006.01)
*H01L 29/78* (2006.01)
(Continued)

(52) U.S. Cl.
CPC .... *H01L 29/78391* (2014.09); *H01L 21/28026* (2013.01); *H01L 21/28291* (2013.01); *H01L 29/0669* (2013.01); *H01L 29/0847* (2013.01); *H01L 29/41783* (2013.01); *H01L 29/49* (2013.01); *H01L 29/516* (2013.01);
(Continued)

(58) Field of Classification Search
USPC .......................... 257/295, E43.001–E43.007, 257/E27.005–E27.006, E27.008, E29.164, 257/E29.167, E29.272, E29.323, E27.104, 257/E21.436, E21.663–E21.665; 438/3, 438/785, E21.208, 202, 216; 365/158, 145, 365/48
See application file for complete search history.

(56) References Cited

U.S. PATENT DOCUMENTS

| 4,831,427 A | 5/1989 | Coleman, Jr. |
| 5,652,445 A | 7/1997 | Johnson |

(Continued)

FOREIGN PATENT DOCUMENTS

| GB | 2473696 A | 3/2011 |
| KR | 1020070020255 A | 2/2007 |

(Continued)

OTHER PUBLICATIONS

Nielsch, K. et al., "Hexagonally Ordered 100 nm Period Nickel Nanowire Arrays" Applied Physics Letters (Aug. 27, 2001) pp. 1360-1362, vol. 79, No. 9.

(Continued)

*Primary Examiner* — Dao H Nguyen
*Assistant Examiner* — Tram H Nguyen
(74) *Attorney, Agent, or Firm* — Scully, Scott, Murphy & Presser, P.C.

(57) ABSTRACT

A semiconductor memory device including a channel region and a ferromagnetic gate is provided. The channel region can be formed within a semiconductor nanowire. The ferromagnetic gate is programmed with a selected orientation of magnetization by the electrical current that passes through the channel region in one direction or another. The orientation of the magnetization in the ferromagnetic gate can be detected by changes in the threshold voltage of a field effect transistor employing the ferromagnetic gate as a gate electrode, or can be detected by the resistance of the channel region that changes with the orientation of the magnetization in a two terminal device.

19 Claims, 9 Drawing Sheets

(51) Int. Cl.
- H01L 29/49 (2006.01)
- H01L 29/06 (2006.01)
- H01L 29/08 (2006.01)
- H01L 29/417 (2006.01)
- H01L 29/66 (2006.01)
- H01L 21/28 (2006.01)
- H03K 17/687 (2006.01)
- H01L 29/51 (2006.01)

(52) U.S. Cl.
CPC ...... *H01L29/6684* (2013.01); *H01L 29/66568* (2013.01); *H03K 17/687* (2013.01)

(56) References Cited

U.S. PATENT DOCUMENTS

| | | | |
|---|---|---|---|
| 8,120,003 | B2 | 2/2012 | Wunnicke |
| 8,125,247 | B2 * | 2/2012 | Koo ........................ B82Y 10/00 257/295 |
| 2010/0032737 | A1 * | 2/2010 | Seol ........................ B82Y 10/00 257/295 |
| 2010/0195381 | A1 | 8/2010 | Karg et al. |
| 2011/0233524 | A1 | 9/2011 | Wang et al. |
| 2012/0198591 | A1 | 8/2012 | Ohnesorge |

FOREIGN PATENT DOCUMENTS

| | | |
|---|---|---|
| KR | 101057131 B1 | 8/2011 |
| WO | 2009011956 A2 | 1/2009 |

OTHER PUBLICATIONS

Chou, S.Y. et al., "Nanolithographically Defined Magnetic Structures and Quantum Magnetic Disk (invited)" Journal of Applied Physics (Apr. 15, 1996) pp. 6101-6106, vol. 79, No. 8.

McGuire, J.P. et al., "The Silicon Inversion Layer With a Ferromagnetic Gate: A Novel Spin Source" Journal of Applied Physics (Oct. 10, 2003) 6 pages.

* cited by examiner

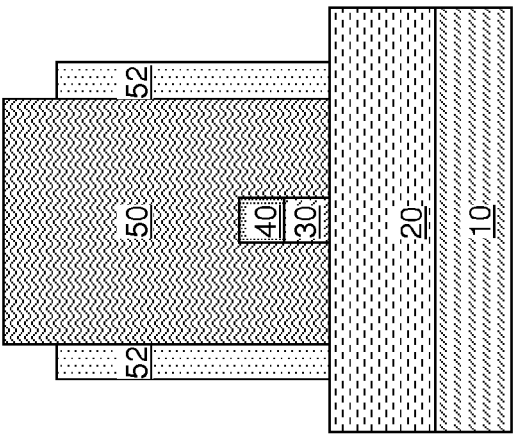
FIG. 2B
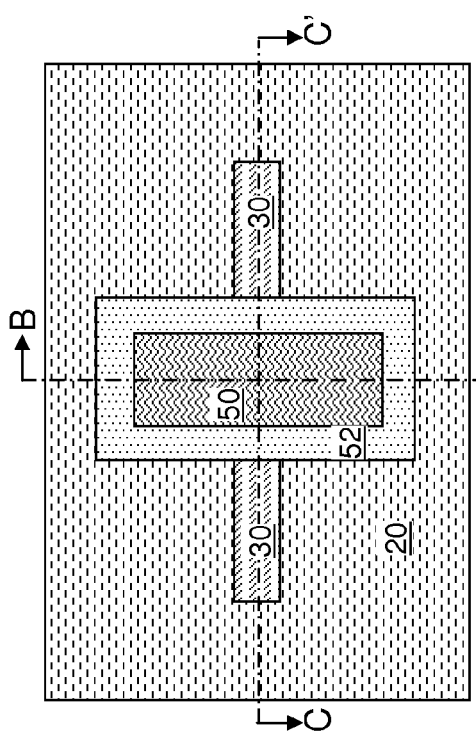
FIG. 2A
FIG. 2C

SEMICONDUCTOR MEMORY DEVICE EMPLOYING A FERROMAGNETIC GATE

BACKGROUND

The present disclosure relates to a semiconductor structure, and particularly to a semiconductor memory device employing a ferromagnetic gate and a method of manufacturing the same.

While dynamic random access memory (DRAM) devices and static random access memory (SRAM) devices are typically employed to store data in a semiconductor circuitry, the DRAM devices and the SRAM devices tend to take up significant spaces. For example, a DRAM device requires a field effect transistor and a charge storage capacitor, and an SRAM device typically requires six field effect transistors. A more compact memory device is thus desired.

SUMMARY

A semiconductor memory device including a channel region and a ferromagnetic gate is provided. The channel region can be formed within a semiconductor nanowire. The ferromagnetic gate is programmed with a selected orientation of magnetization by the electrical current that passes through the channel region in one direction or another. The orientation of the magnetization in the ferromagnetic gate can be detected by changes in the threshold voltage of a field effect transistor employing the ferromagnetic gate as a gate electrode, or can be detected by the resistance of the channel region that changes with the orientation of the magnetization in a two terminal device.

According to an aspect of the present disclosure, a semiconductor structure is provided, which includes a semiconductor nanowire located on a substrate and including a channel region, an upper dielectric material portion located on a top surface of the channel region, a lower dielectric material portion located underneath a bottom surface of the channel region, and a gate dielectric contacting the channel region, the upper dielectric material portion, and the lower dielectric material portion. The semiconductor structure further includes a ferromagnetic gate structure located on the gate dielectric.

According to another aspect of the present disclosure, a method of forming a semiconductor structure is provided. A semiconductor nanowire is formed on an insulator layer. A gate dielectric is formed on surfaces of the semiconductor nanowire. A ferromagnetic gate structure is formed on the gate dielectric. The ferromagnetic gate structure straddles the semiconductor nanowire.

According to yet another aspect of the present disclosure, a method of operating a semiconductor device is provided. A semiconductor device including a semiconductor structure is provided. The semiconductor structure includes a semiconductor nanowire located on a substrate and including a channel region, an upper dielectric material portion located on a top surface of the channel region, a lower dielectric material portion located underneath a bottom surface of the channel region, and a gate dielectric contacting the channel region, the upper dielectric material portion, and the lower dielectric material portion. The semiconductor structure further includes a ferromagnetic gate structure located on the gate dielectric. The method of operating the semiconductor device includes magnetizing the ferromagnetic gate structure by passing electrical current along a lengthwise direction of the semiconductor nanowire, and detecting a direction of magnetization in the ferromagnetic gate structure by measuring a magnitude of electrical current that passes through the semiconductor nanowire along the lengthwise direction under a predetermined measurement setting.

BRIEF DESCRIPTION OF SEVERAL VIEWS OF THE DRAWINGS

FIG. 2A is a top-down view of a first exemplary semiconductor structure after formation of a disposable gate structure and a gate spacer, and patterning of the upper dielectric material portion according to an embodiment of the present disclosure.

FIG. 2B is a vertical cross-sectional view of the first exemplary semiconductor structure along the vertical plane B-B' of FIG. 2A.

FIG. 2C is a vertical cross-sectional view of the first exemplary semiconductor structure along the vertical plane C-C' of FIG. 2A.

DETAILED DESCRIPTION

Figure 1B:
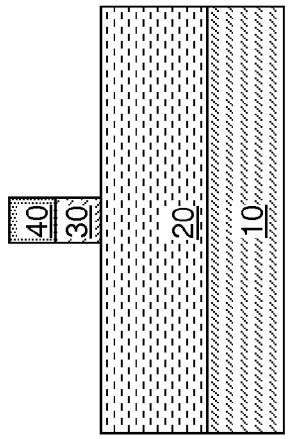
FIG. 1B is a vertical cross-sectional view of the first exemplary semiconductor structure along the vertical plane B-B' of FIG. 1A.

As stated above, the present disclosure relates to a field effect transistor including a wraparound gate formed by dual replacement of disposable layers and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1A:
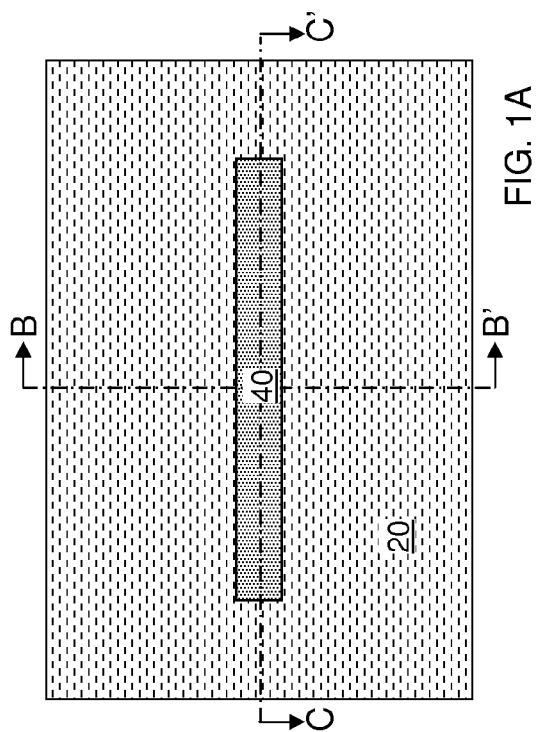
FIG. 1A is a top-down view of a first exemplary semiconductor structure after formation of a vertical stack including, from bottom to top, a semiconductor nanowire and an upper dielectric material portion on an insulator layer of a substrate according to an embodiment of the present disclosure.
Figure 1C:
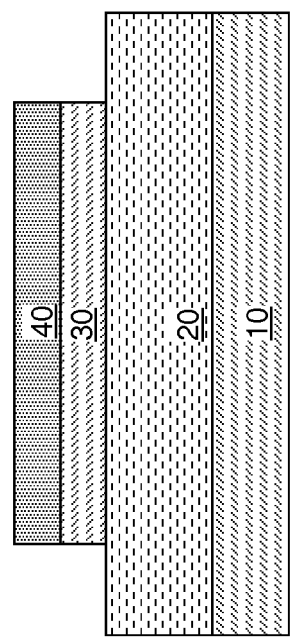
FIG. 1C is a vertical cross-sectional view of the first exemplary semiconductor structure along the vertical plane C-C' of FIG. 1A.

Referring to FIG. 1A-1C, a first exemplary semiconductor structure according to an embodiment of the present disclosure includes a substrate (10, 20) containing a handle substrate 10 and an insulator layer 20. The handle substrate 10 can include a semiconductor material, a conductive material, and/or a dielectric material. The handle substrate 10 can provide mechanical support to the insulator layer 20 and structures thereupon. The thickness of the handle substrate 10 can be from 30 microns to 2 mm, although lesser and greater thicknesses can also be employed.

The insulator layer 20 includes a dielectric material such as silicon oxide, silicon nitride, a dielectric metal oxide, or a combination thereof. The thickness of the insulator layer 20 can be from 50 nm to 5 microns, although lesser and greater thicknesses can also be employed.

A stack of a semiconductor nanowire 30 and an upper dielectric material portion 40 can be formed on the top surface of the insulator layer 20. As used herein, a semiconductor nanowire refers to a semiconductor structure having lateral dimensions in a range from 1 nm to 100 nm and extending along a lengthwise direction that is perpendicular to the direction of the lateral dimensions. The lateral dimensions include a vertical dimension and a horizontal dimension that is perpendicular to the lengthwise direction.

The stack of the semiconductor nanowire 30 and the upper dielectric material portion 40 can be formed, for example, by providing a semiconductor-on-insulator (SOI) substrate including, from bottom to top, the handle substrate 10, the insulator layer 20, and a top semiconductor layer including a semiconductor material, by depositing a dielectric material layer over the SOI substrate as a blanket material layer, and by patterning the dielectric material layer and the top semiconductor material by a combination of lithographic methods and an anisotropic etch.

The top semiconductor layer provided within the SOI substrate can include a single crystalline semiconductor material or a polycrystalline semiconductor material. In one embodiment, the top semiconductor layer can be a single crystalline silicon layer. The thickness of the top semiconductor layer can be in a range from 10 nm to 100 nm, although lesser and greater thicknesses can also be employed.

The dielectric material layer deposited over the top semiconductor layer includes a dielectric material such as silicon nitride, a dielectric metal oxide, or silicon oxide. In one embodiment, the dielectric material layer can include a different material than the insulator layer 20. In an illustrative example, the dielectric material layer can include silicon nitride, and the insulator layer 20 can include silicon oxide. The thickness of the dielectric material layer can be in a range from 10 nm to 100 nm, although lesser and greater thicknesses can also be employed.

The patterning the dielectric material layer and the top semiconductor material can be performed, for example, by applying a photoresist layer on the top surface of the dielectric material layer, and by lithographically patterning the photoresist layer so that a rectangular patterned portion of the photoresist layer remains over the top surface of the dielectric material layer. Subsequently, the pattern in the photoresist layer can be transferred through the dielectric material layer and the top semiconductor layer by an anisotropic etch, which can be a reactive ion etch. In one embodiment, the reactive ion etch can be selective to the dielectric material of the insulator layer 20.

The width of the rectangular patterned portion of the photoresist layer can be the same as the widths of the remaining portions of the dielectric material layer and the top semiconductor layer, and can be in a range from 20 nm to 100 nm, although lesser and greater widths can also be employed. The remaining portion of the dielectric material layer constitutes the upper dielectric material portion 40, and the remaining portion of the top semiconductor layer constitutes the semiconductor nanowire 30. The length of the stack of the semiconductor nanowire 30 and the upper dielectric material portion 40 can be in a range from 80 nm to 1,000 nm, although lesser and greater lengths can also be employed. The remaining portions of the photoresist layer can be removed, for example, by ashing. All sidewalls of the upper dielectric material portion 40 can be vertically coincident with sidewalls of the semiconductor nanowire 30.

Referring to FIGS. 2A-2C, a disposable gate structure 50 is formed across the stack of the semiconductor nanowire 30 and the upper dielectric material portion 40. The disposable gate structure 50 includes a disposable material that can be subsequently removed selected to the materials of the insulator layer 20 and the upper dielectric material portion 40. The disposable material can include, for example, a semiconductor material, a dielectric material different from the dielectric materials of the insulator layer 20 and the upper dielectric material portion 40, or a metallic material such as an elemental metal, an intermetallic alloy, or a conductive metallic nitride. The disposable material can be deposited as a contiguous layer by a deposition method such as chemical vapor deposition (CVD) or physical vapor deposition (PVD), and can be subsequently patterned by a combination of lithographic methods and an anisotropic etch. The anisotropic etch can be selective to the dielectric material of the insulator layer 20. The remaining portion of the disposable material after patterning constitutes the disposable gate structure 50, which straddles the stack of the semiconductor nanowire 30 and the upper dielectric material portion 40.

A gate spacer 52 is formed on the sidewalls of the disposable gate structure 50. The gate spacer 52 includes a dielectric material that is different from the dielectric material of the insulator layer 20. The gate spacer 52 and the insulator layer 20 may have the same material, or may have different materials. For example, the insulator layer 20 can include silicon oxide, and the gate spacer 52 can include silicon nitride, silicon oxide, or a dielectric metal oxide. The dielectric spacer 52 can be formed, for example, by deposition of a conformal dielectric material layer and a first anisotropic etch that etches horizontal portions of the conformal dielectric material layer. An overetch can be performed during the first anisotropic etch process to remove vertical portions of the conformal dielectric material layer from sidewalls of the semiconductor nanowire 30.

A second anisotropic etch is performed to remove physically exposed portions of the upper dielectric material portion 40. The etch chemistry of the second anisotropic etch is selective to the semiconductor material of the semiconductor nanowire 30, and can be selective to the dielectric material of the insulator layer 20. A top portion of the gate spacer 52 can be collaterally etched during the etching of the physically exposed portions of the upper dielectric material portion 40. In one embodiment, the insulator layer 20 can include silicon oxide, and the upper dielectric material portion 40 and the gate spacer 52 can include silicon nitride, and the second anisotropic etch can etch silicon nitride selective to silicon oxide and the semiconductor material of the semiconductor nanowire 30. In another embodiment, the insulator layer 20 and the gate spacer 52 can include silicon oxide, and the upper dielectric material portion 40 can include silicon nitride, and the second anisotropic etch can etch silicon nitride selective to silicon oxide and the semiconductor material of the semiconductor nanowire 30. Additional combinations of materials may also be employed. The second anisotropic etch may be selective to the disposable material of the disposable gate structure 50, or may collaterally etch some of the disposable material of the disposable gate structure 50.

The second anisotropic etch patterns the upper dielectric material portion 40 such that the widthwise sidewalls of the upper dielectric material portion 40 are vertically coincident with, i.e., are present within the same vertical plane as, outer sidewalls of the gate spacer 52. The lengthwise sidewalls of the upper dielectric material portion 40 are vertically coincident with the lengthwise sidewalls of the semiconductor nanowire 30. In an alternative embodiment, the upper dielectric material portion 40 may have sidewalls which are vertically coincident with the sidewalls of the gate structure 50. In other words, the upper dielectric material portion 40 can be patterned after formation of the disposable gate structure such that the remaining portion of the upper dielectric material portion 40 have sidewalls that are vertically coincident with the sidewalls of the disposable gate structure 50. Subsequently, the gate spacer 52 can be formed.

Figure 3B:
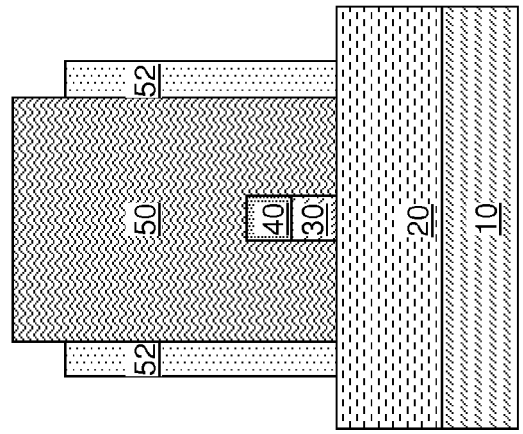
FIG. 3B is a vertical cross-sectional view of the first exemplary semiconductor structure along the vertical plane B-B' of FIG. 3A.
Figure 3A:
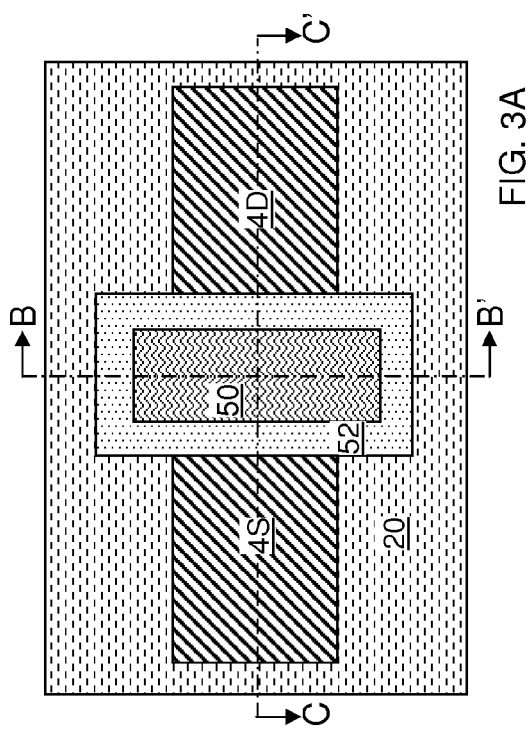
FIG. 3A is a top-down view of a first exemplary semiconductor structure after formation of a source region, a drain region, a raised source region, and a raised drain region according to an embodiment of the present disclosure.
Figure 3C:
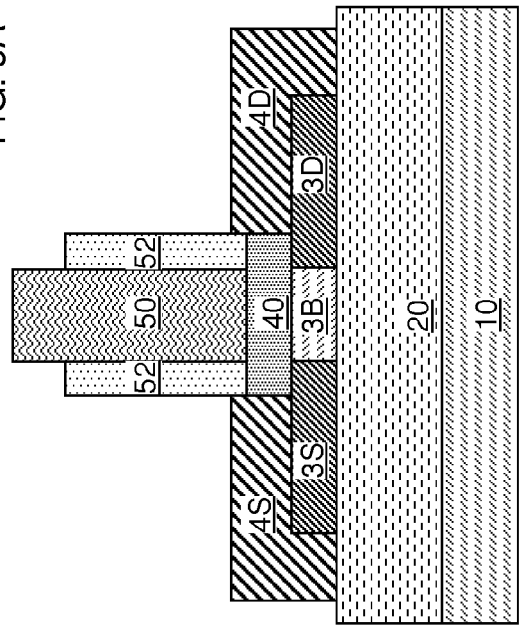
FIG. 3C is a vertical cross-sectional view of the first exemplary semiconductor structure along the vertical plane C-C' of FIG. 3A.

Referring to FIGS. 3A-3C, a source region 3S and a drain region 3D can be formed in end portions of the semiconductor nanowire 30. The source region 3S and the drain region 3D can be formed, for example, by implanting electrical dopants (which can be p-type dopants or n-type dopants) into physically exposed portions of the semiconductor nanowire 30 employing the combination of the disposable gate structure 50 and the gate spacer 52 as an etch mask. In one embodiment, the semiconductor nanowire 30 as provided after the processing steps of FIGS. 1A-1C can have a doping of a first conductivity type (which can be p-type or n-type) prior to formation of the source region 3S and the drain region 3D, and the electrical dopants implanted into the source region 3S and the drain region 3D can have a second conductivity type that is the opposite of the first conductivity type. For example, if the first conductivity type is p-type, the second conductivity type is n-type, and vice versa. The portion of each semiconductor nanowire 30 that excludes a source region 3S and a drain region 3D constitutes a channel region 3B, which can have a doping of a first conductivity type at a first dopant concentration. The source region(s) 3S can have a doping of a second conductivity type at a second dopant concentration that is greater than the first dopant concentration. The drain region(s) 3D can include dopants of the second conductivity type, and thus, have a doping of the second conductivity type, at a third concentration that is greater than the first concentration and may, or may not, be the same as the second concentration. The second conductivity type is opposite of the first conductivity type.

Alternatively, the electrical dopants implanted into the source region 3S and the drain region 3D can be dopants of the first conductivity type. Yet alternately, the implantation of the electrical dopants may be omitted so that the entirety of the semiconductor nanowire 30 can have a doping of the first conductivity type as a same dopant concentration throughout.

Still alternatively, the source region 3S and drain regions 3D can be doped with dopants of the opposite conductivity types such that the source region 3S and the drain region 3D are oppositely doped. In other words, one of the source region 3S and the drain region 3D is a p-doped region, and the other of the source region 3S and the drain region 3D is an n-doped region. In this case, a tunnel field effect transistor (TFET) structure may be subsequently obtained. A tunnel field effect transistor operates on band-to-band tunneling current rather than thermal current, and operates as a switching device of which the transconductance can be altered by magnetic fields. In one embodiment, the drain region 3D can be doped with dopants of the first conductivity type at a higher dopant concentration than the dopant concentration of the channel region 3B, and the source region 3S is doped with dopants of the second conductivity type at a dopant concentration comparable to the dopant concentration of the drain region 3D and higher than the dopant concentration of the channel region 3B. The channel region 3B can have a doping of a first conductivity type at a first dopant concentration. The source region(s) 3S can have a doping of a second conductivity type at a second dopant concentration that is greater than the first dopant concentration. The drain region(s) 3D can include dopants of the first conductivity type, and thus, have a doping of the first conductivity type, at a third concentration that is greater than the first concentration and may, or may not, be the same as the second concentration. The second conductivity type is opposite of the first conductivity type.

If an ion implantation process is employed, the portion of the semiconductor nanowire 30 that is not implanted with the additional dopants during the ion implantation process constitutes a channel region 3B. If no ion implantation process is employed, the channel region 3B can be defined as the region of which the surface is in direct contact with the disposable gate structure 50, and is subsequently in direct contact with the gate dielectric 70. The channel region 3B underlies the disposable gate structure 50. A first p-n junction can be present between the source region 3S and the channel region 3B, and a second p-n junction can be present between the drain region 3D and the channel region 3B. Due to the lateral straggle of implanted electrical dopants, the p-n junctions can be laterally offset from vertical planes including outer sidewalls of the gate spacer 52.

Optionally, a selective epitaxy process can be performed to form a raised source region 4S and a raised drain region 4D. The raised source region 4S can be deposited directly on the source region 3S, and the raised drain region 4D can be deposited directly on the drain region 3D. The raised source region 4S and the raised drain region 4D can be formed simultaneously by depositing a doped semiconductor material in epitaxial alignment with the semiconductor material in the source region 3S and the drain region 3D. In case the semiconductor nanowire (3S, 3B, 3D) is single crystalline, the entire structure including the semiconductor nanowire (3S, 3B, 3D), the raised source region 4S, and the raised drain region 4D can be single crystalline.

The raised source region 4S and the raised drain region 4D have the same type of doping as the source region 3S and the drain region 3D, i.e., a doping of the second conductivity type. Electrical dopants can be introduced into the raised source region 4S and the raised drain region 4D by in-situ doping during the selective epitaxy process, or can be implanted into the raised source region 4S and the raised drain region 4D by ion implantation. The semiconductor material of the semiconductor nanowire (3S, 3B, 3D) is herein referred to as a first semiconductor material, and the semiconductor material of the raised source and drain regions (4S, 4D) is herein referred to as a second semiconductor material. The second semiconductor material can be the same as, or can be different from, the first semiconductor material. Depending on the process conditions, facets can be formed on the raised source and drain regions (4S, 4D). The thickness of the raised source and drain regions (4S, 4D), as measured on the top surface of the source region 3S and the drain region 3D, can be in a range from 5 nm to 100 nm, although lesser and greater thicknesses can also be employed.

Figure 4A:
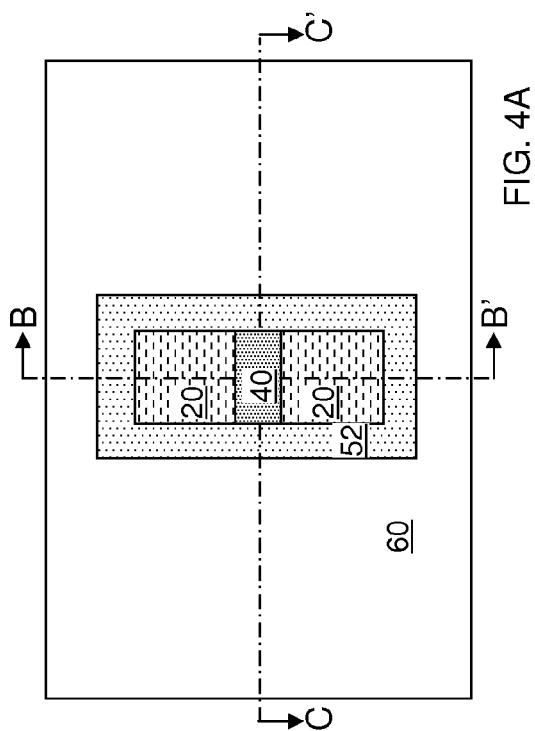
FIG. 4A is a top-down view of a first exemplary semiconductor structure after formation of a planarization dielectric layer and removal of the disposable gate structure and a recess etch into physically exposed portions of the insulator layer according to an embodiment of the present disclosure.
Figure 4B:
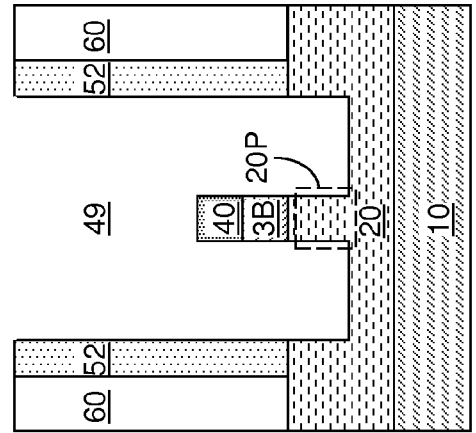
FIG. 4B is a vertical cross-sectional view of the first exemplary semiconductor structure along the vertical plane B-B' of FIG. 4A.
Figure 4C:
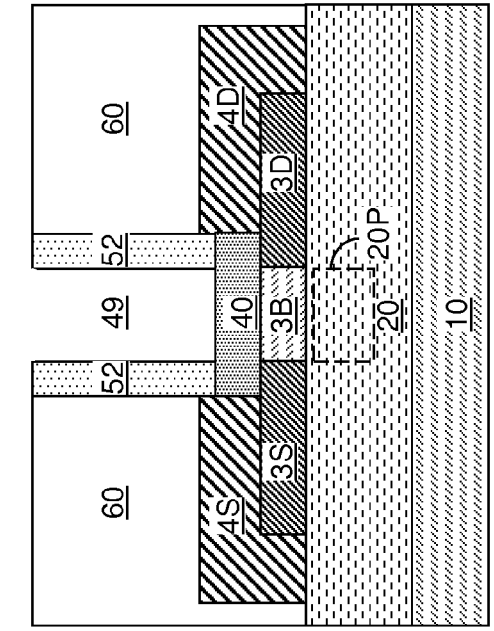
FIG. 4C is a vertical cross-sectional view of the first exemplary semiconductor structure along the vertical plane C-C' of FIG. 4A.

Referring to FIGS. 4A-4C, a planarization dielectric layer 60 is formed over the raised source and drain regions (4S, 4D) and the disposable gate structure 50, and is subsequently planarized employing the gate spacer 52 as a stopping structure. The planarization dielectric layer 60 includes a dielectric material such as silicon oxide, silicon nitride, porous or non-porous organosilicate glass (OSG), or a combination thereof. The planarization dielectric layer 60 can be deposited, for example, by chemical vapor deposition (CVD) or by spin-coating. The planarization dielectric layer can be planarized by chemical mechanical planarization (CMP). Thus, the planarization dielectric layer 60 is formed over the semiconductor nanowire (3S, 3B, 3D) and around the disposable gate structure 50. The top surface of the planarization dielectric layer 60 after planarization can be coplanar with the top surface of the gate spacer 52 and a remaining portion of the disposable gate structure 50.

The disposable gate structure 50 is removed selective to the dielectric materials of the planarization dielectric layer 60, the gate spacers 52, and the upper dielectric material portion 40 by an etch process, which can be an isotropic etch process or an anisotropic etch process. A gate cavity 49 is formed within a space from which the disposable gate structure 50 is removed. In an illustrative example, if the disposable gate structure 50 includes germanium or a silicon germanium alloy having an atomic concentration of germanium greater than 50%, a hydrogen peroxide solution can be employed to remove the disposable gate structure 50 selective to the gate spacer 52, the planarization dielectric layer 60, the semiconductor fin (3S, 3B, 3D), the upper dielectric material portion 40, and the insulator layer 20.

Subsequently, an anisotropic etch is performed to vertically recess the horizontal surfaces of the insulator layer 20 selective to the upper dielectric material portion 40. The gate cavity 49 is vertically extended in regions that exclude the area of the stack of the semiconductor nanowire (3S, 3B, 3D) and the upper dielectric material portion 40. Sidewalls of the insulator layer 20 around the extended gate cavity 49 can be vertically coincident with inner sidewalls of the gate spacer 52 and sidewalls of the semiconductor nanowire (3S, 3B, 3D) and the upper dielectric material portion 40. The depth of recess of the gate cavity 49 below the top surface of the insulator layer 20, i.e., the vertical distance between the recessed bottom surface of the gate cavity 49 and the top surface of the insulator layer 20, can be in a range from 30 nm to 200 nm, although lesser and greater thicknesses can also be employed.

A portion of the insulator layer 20 laterally bounded by a pair of sidewalls of the insulator layer 20 that are vertically coincident with the sidewalls of the semiconductor fin (3S, 3B, 3D) is herein referred to as a lower dielectric material portion 20P. The lower dielectric material portion 20P is a portion of the insulator layer 20, and includes sidewalls that are vertically coincident with the sidewalls of the semiconductor material fin (3S, 3B, 3D) and the upper dielectric material portion 40.

Figure 5A:
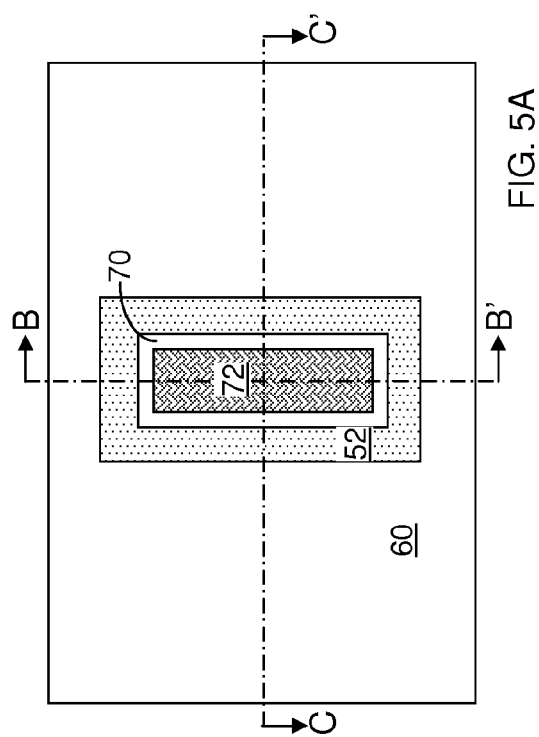
FIG. 5A is a top-down view of a first exemplary semiconductor structure after formation of a ferromagnetic gate structure according to an embodiment of the present disclosure.
Figure 5B:
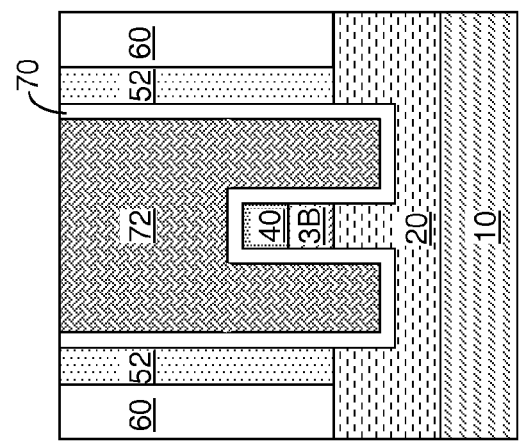
FIG. 5B is a vertical cross-sectional view of the first exemplary semiconductor structure along the vertical plane B-B' of FIG. 5A.
Figure 5C:
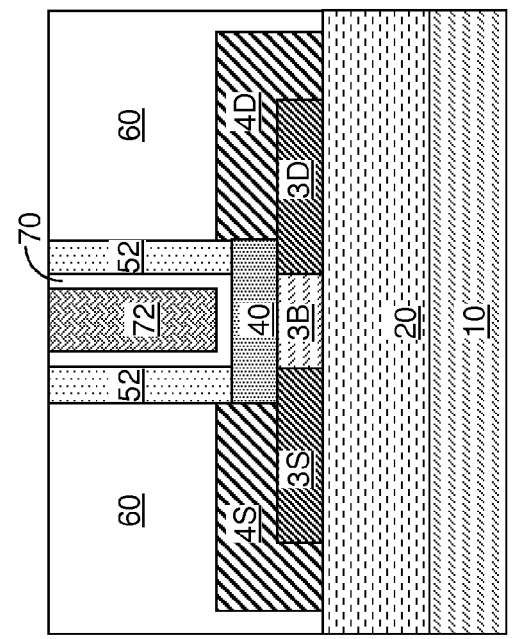
FIG. 5C is a vertical cross-sectional view of the first exemplary semiconductor structure along the vertical plane C-C' of FIG. 5A.

Referring to FIGS. 5A-5C, a gate dielectric 70 and a ferromagnetic gate structure 72 are formed within the gate cavity 49. Specifically, a gate dielectric layer is formed on the surfaces of the gate cavity 49, which include recessed top surfaces and sidewall surfaces of the insulator layer 20, sidewall surfaces of the semiconductor fin (3S, 3B, 3D), sidewall surfaces of the upper dielectric material portion 40, and inner sidewalls of the gate spacer 52. The sidewall surfaces of the insulator layer 20 include sidewall surfaces of the lower dielectric material portion 20P.

The gate dielectric layer can include any gate dielectric material layer known in the art. For example, the gate dielectric layer can include silicon oxide, silicon oxynitride, silicon nitride, a dielectric metal oxide, a dielectric metal nitride, or a stack thereof. The thickness of the gate dielectric layer can be in a range from 1 nm to 10 nm, although lesser and greater thicknesses can also be employed.

A ferromagnetic material layer is subsequently deposited to fill the gate cavity 49. The ferromagnetic material can be any ferromagnetic material known in the art. For example, the ferromagnetic material can include at least one of iron, cobalt, nickel, a magnetic alloy including at least one transition metal element, a rare earth magnetic element, and a magnetic alloy including at least one rare earth magnetic element. The ferromagnetic material layer can be deposited, for example, by physical vapor deposition (PVD). The thickness of the deposited ferromagnetic material layer is selected such that the entirety of the gate cavity is filled by the deposited ferromagnetic material.

The portions of the ferromagnetic material layer and the gate dielectric layer above a horizontal plane including the top surface of the planarization dielectric layer 60 can be removed, for example, by chemical mechanical planarization. The remaining portion of the ferromagnetic material layer in the gate cavity constitutes the ferromagnetic gate structure 72. The remaining portion of the gate dielectric layer in the gate cavity constitutes the gate dielectric 70.

Figure 6:
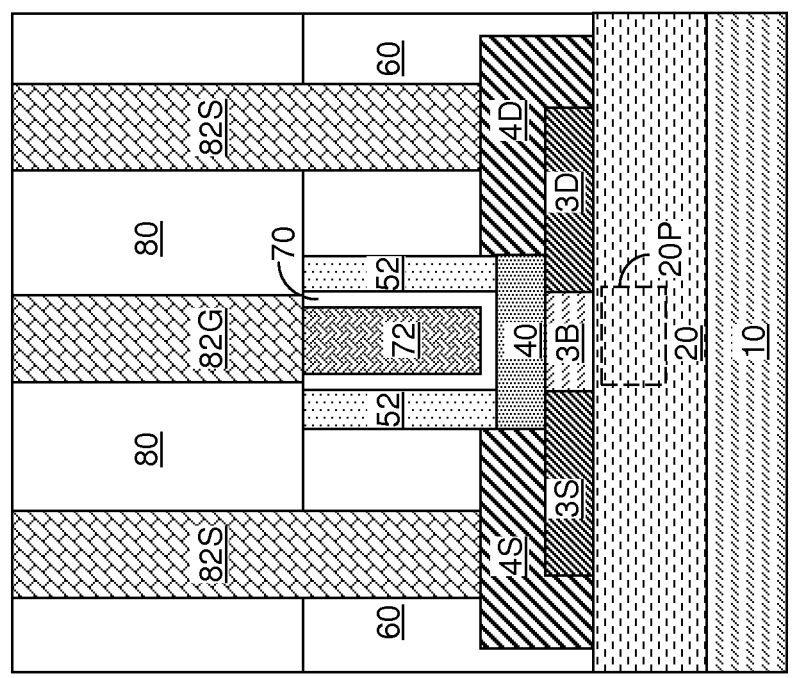
FIG. 6 is a vertical cross-sectional view of the first exemplary semiconductor structure after formation of a contact level dielectric layer and various contact via structures according to an embodiment of the present disclosure.

Referring to FIG. 6. a contact level dielectric layer 80 is formed above the planarization dielectric layer 60 and the ferromagnetic gate structure 72. The contact level dielectric layer 80 includes a dielectric material such as undoped silicate glass (USG), doped silicate glass, organosilicate glass (OSG), or a combination thereof. The contact level dielectric layer 80 can be deposited, for example, by chemical vapor deposition (CVD). The thickness of the contact level dielectric layer 80 can be in a range from 30 nm to 600 nm, although lesser and greater thicknesses can also be employed.

Contact via structures (82S, 82D, 82G) can be formed through the contact level dielectric layer 80 and the planarization dielectric layer 60 by forming via cavities through the contact level dielectric layer 80 and the planarization dielectric layer 60, and by filling the via cavities with a conductive material such as a metallic material. The contact via structures (82S, 82D, 82G) can include a source contact via structure 82S that contacts the raised source region 4S (or the source region 3S), a drain contact via structure 82D that contacts the raised drain region 4D (or the drain region 3D), and a gate contact via structure 82G that contacts the ferromagnetic gate structure 72. The contact via structures (82S, 82D, 82G) can include a non-ferromagnetic metallic material.

The first exemplary semiconductor structure includes a semiconductor nanowire (3S, 3B, 3D) located on a substrate, i.e., a handle substrate 10, and including a channel region 3B; an upper dielectric material portion 40 located on a top surface of the channel region 3B; a lower dielectric material portion 20P located underneath a bottom surface of the channel region 3B; a gate dielectric 70 contacting the channel region 3B, the upper dielectric material portion 40, and the lower dielectric material portion 20P; and a ferromagnetic gate structure 72 located on the gate dielectric 70. The sidewalls of the channel region 3B can be vertically coincident with sidewalls of the upper dielectric material portion 40. The sidewalls of the lower dielectric material portion 20P can be vertically coincident with the sidewalls of the channel region 3B. See FIG. 4B.

The first exemplary semiconductor structure can further include an insulator layer 20 including a dielectric material and including a top surface in contact with the entirety of the bottom surface of the semiconductor nanowire (3S, 3B, 3D). The lower dielectric material portion 20P is a portion of the insulator layer 20. In one embodiment, the ferromagnetic gate structure 72 extends below the top surface of the insulator layer 20.

The semiconductor nanowire (3S, 3B, 3D) can include a source region 3S contacting a sidewall of the channel region 3B, and a drain region 3D contacting another sidewall of the channel region 3B. In one embodiment, the channel region 3B can have a doping of a first conductivity type at a first dopant concentration, the source region 3S and the drain region 3D can have a doping of a second conductivity type at a second dopant concentration that is greater than the first dopant concentration. The second conductivity type is the opposite of the first conductivity type.

The first exemplary semiconductor structure can include a raised source region 4S located on the source region 3S, and a raised drain region 3D located on the drain region 3D. The raised source region 4S and the raised drain region 4D can have a doped semiconductor material in epitaxial alignment with the semiconductor material in the semiconductor nanowire (3S, 3B, 3D). The contact level dielectric material layer 80 overlies the ferromagnetic gate structure 72. The gate contact via structure 82G is embedded in the contact level dielectric material layer 80, and contacts a top surface of the ferromagnetic gate structure 72.

The first exemplary semiconductor structure is a semiconductor device that functions as a memory device. In one operational mode, the ferromagnetic gate structure 72 can be magnetized by passing electrical current along the lengthwise direction of the semiconductor nanowire (3S, 3B, 3D). Since the electrical current passes along the lengthwise direction of the semiconductor nanowire (3S, 3B, 3D), the magnetic field generated by the electrical current has a circumferential direction that is perpendicular to the lengthwise direction of the semiconductor nanowire (3S, 3B, 3D). Once the direction from the center of mass of the source region 3S to the center of mass of the drain region 3D is taken as a reference lengthwise direction along which the magnetic field line is observed (i.e., with the observer's eye on the side of the source region 3S), the circumferential direction can be clockwise or counterclockwise depending on whether the electrical current passes from the source region 3S to the drain region 3D or from the drain region 3D to the source region 3S. Accordingly, the magnetization of the ferromagnetic material in the ferromagnetic gate structure 72 can be clockwise or counterclockwise depending on the direction of the electrical current that magnetizes the ferromagnetic material of the ferromagnetic gate structure 72.

The direction of magnetization in the ferromagnetic gate structure 72 can be detected by measuring the magnitude of electrical current that passes through the semiconductor nanowire (3S, 3B, 3D) along the lengthwise direction under a predetermined measurement setting. This is because a magnetized ferromagnetic gate structure 72 applied a magnetic field that has a tangential component (which is perpendicular to the radial direction from the lengthwise axis of the semiconductor nanowire (3S, 3B, 3D)) within the channel region 3B. The non-circular vertical cross-sectional configuration of the ferromagnetic gate structure 72 along the direction perpendicular to the lengthwise direction of the semiconductor nanowire (3S, 3B, 3D), and in particular, the presence of the upper dielectric material portion 40 and the lower dielectric material portion 20P, ensures that a significant percentage of the magnetic field penetrates into the channel region 3B of the semiconductor nanowire (3S, 3D, 3B) once the ferromagnetic gate structure 72 is magnetized.

Depending on the direction of the electrical flow in the channel region 3B and the direction of magnetization in the ferromagnetic gate structure 72, the magnetic force can push the moving charge carriers within the channel region 3B toward the lengthwise axis of the semiconductor nanowire (3S, 3B, 3D), or can push the moving charge carriers within the channel region 3B toward the surface regions of the channel region 3B. If the traveling charge carriers are pushed toward the lengthwise axis of the semiconductor nanowire (3S, 3B, 3D), the channel region 3B displays the characteristic of charge crowding, and thus, the effective resistivity of the channel region 3B increases, and results in a lesser current than without the effect of charge crowding. If the traveling charge carriers are pushed toward the surfaces of the semiconductor nanowire (3S, 3B, 3D), the channel region 3B displays the characteristic of anti-charge crowding, or charge dispersion, and thus, the effective resistivity of the channel region 3B decreases, and results in a more current than without the effect of anti-charge crowding, and thus. Thus, for a predetermined electrical bias voltage between the source region 3S and the drain region 3D during sensing (i.e., detection of the state of the ferromagnetic gate structure 72), the electrical current can vary depending on the direction of the previous current flow through the semiconductor nanowire (3S, 3B, 3D). Thus, the first exemplary semiconductor structure functions as a memory device in which the memory is stored as the direction of magnetization of the ferromagnetic gate structure 72.

In one embodiment, the semiconductor device can be a transistor including the ferromagnetic gate structure 72 as a gate electrode, and the measurement of the magnitude of electrical current is a measurement of electrical current between the source region 3S and the drain region 3D in the semiconductor nanowire (3S, 3B, 3D) in the presence of a bias voltage applied to the gate electrode. In this case, the bias voltage is applied to the ferromagnetic gate structure 72 during measurement of the magnitude of the electrical current under the predetermined measurement setting, which include a non-zero bias voltages across the drain region 3D and the source region 3S, and a non-zero bias voltage or a zero bias voltage applied across the ferromagnetic gate structure 72 and the source region 3S.

Figure 7:
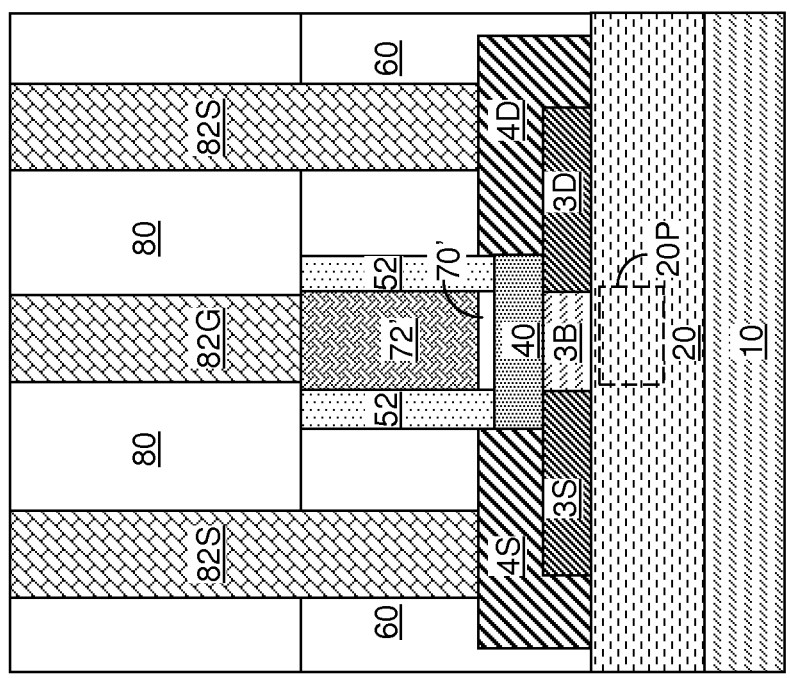
FIG. 7 is a vertical cross-sectional view of a variation of the first exemplary semiconductor structure.

Referring to FIG. 7, a variation of the first exemplary semiconductor structure can be derived from the first exemplary semiconductor structure by forming a gate dielectric 70' and a ferromagnetic gate structure 72' in lieu of the disposable gate structure 50 at the processing steps of FIGS. 2A-2C. In this case, a gate dielectric layer and a ferromagnetic material layer are sequentially deposited on the structure provided at the end of the processing steps of FIGS. 1A-1C, and are patterned to form the gate dielectric 70' and the ferromagnetic gate structure 72'. The gate dielectric 70' can have the same composition as the gate dielectric 70, and the ferromagnetic gate structure 72' can have the same composition as the ferromagnetic gate structure 72.

Figure 8:
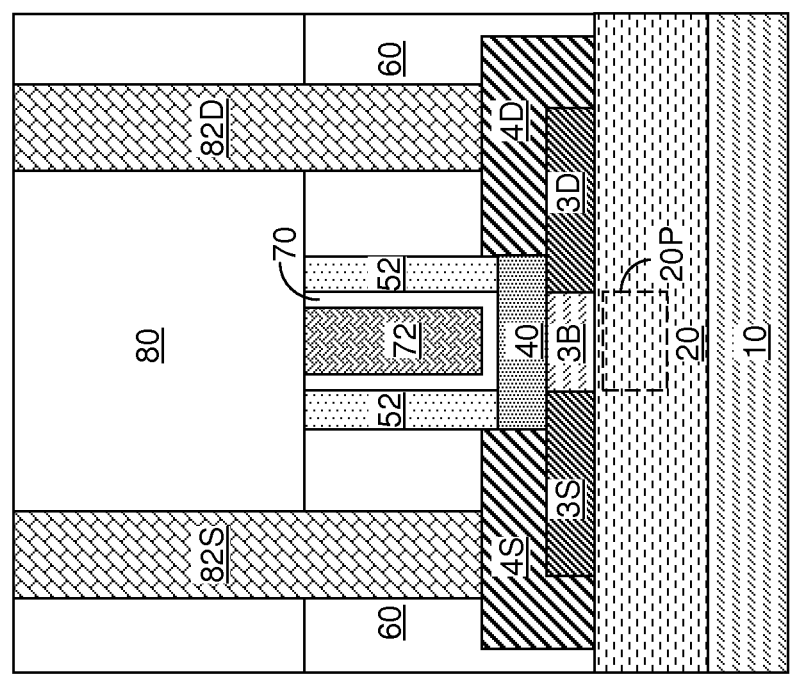
FIG. 8 is a vertical cross-sectional view of a second exemplary semiconductor structure according to another embodiment of the present disclosure.

Referring to FIG. 8, a second exemplary semiconductor structure can be derived from the first exemplary semiconductor structure by not forming a contact via structure providing electrical contact to the ferromagnetic gate structure 72. In this case, all surfaces of the ferromagnetic gate structure 72 contacts dielectric surfaces, and the ferromagnetic gate structure 72 is electrically isolated. In other words, all surfaces of the ferromagnetic gate structure 72 are in contact with dielectric surfaces.

Specifically, the second exemplary semiconductor structure includes a contact level dielectric material layer 80 overlying the ferromagnetic gate structure 72, a source contact via structure 82S embedded in the contact level dielectric material layer 80 and electrically shorted to a source region 3S in the semiconductor nanowire (3S, 3B, 3D), and a drain contact via structure 82D embedded in the contact level dielectric material layer 80 and electrically shorted to a drain region 3D in the semiconductor nanowire (3S, 3B, 3D). The ferromagnetic gate structure 72 is electrically isolated from the semiconductor nanowire (3S, 3B, 3D) and any conductive structure (82S, 82D) embedded in the contact level dielectric material layer 80. The ferromagnetic gate structure 72 is electrically floating.

The semiconductor device in the variation of the semiconductor structure illustrated in FIG. 8 includes a channel region 3B including electrical dopants at a first concentration, and a source region and a drain region including electrical dopants at a second concentration that is greater than the first concentration. The ferromagnetic gate structure 72 can be magnetized by passing electrical current along the lengthwise direction of the semiconductor nanowire (3S, 3B, 3D). The direction of magnetization in the ferromagnetic gate structure 72 can be detected by measuring the magnitude of electrical current that passes through the semiconductor nanowire (3S, 3B, 3D) along the lengthwise direction under a predetermined measurement setting. The method of measurement can be the same as in the case of the semiconductor device illustrated in FIG. 6 except that no bias voltage is applied to the ferromagnetic gate structure 72. In other words, the measurement of the magnitude of electrical current is a measurement of electrical resistance between the source region 3S and the drain region 3D while no bias voltage is applied to the ferromagnetic gate structure 72.

Figure 9:
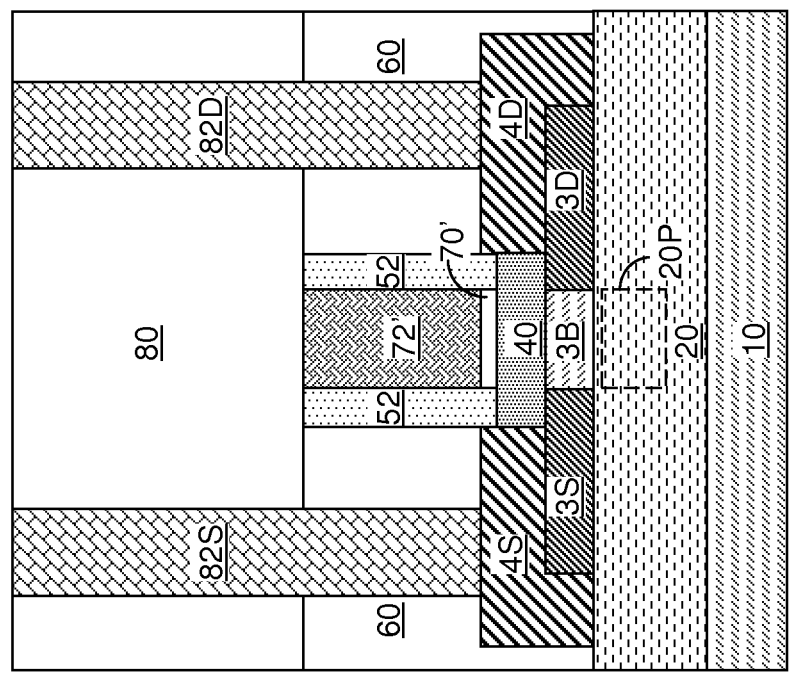
FIG. 9 is a vertical cross-sectional view of a variation of the second exemplary semiconductor structure.

Referring to FIG. 9, a variation of the second exemplary semiconductor structure can be derived from the second exemplary semiconductor structure by forming a gate dielectric 70' and a ferromagnetic gate structure 72' in lieu of the disposable gate structure 50 at the processing steps of FIGS. 2A-2C. In this case, a gate dielectric layer and a ferromagnetic material layer are sequentially deposited on the structure provided at the end of the processing steps of FIGS. 1A-1C, and are patterned to form the gate dielectric 70' and the ferromagnetic gate structure 72'. The gate dielectric 70' can have the same composition as the gate dielectric 70, and the ferromagnetic gate structure 72' can have the same composition as the ferromagnetic gate structure 72.

The semiconductor devices of the present disclosure are memory devices that can be manufactured on a commercially available semiconductor substrate. Further, the processing steps for manufacturing the semiconductor device of the present disclosure are compatible with processing steps for manufacturing field effect transistors on a semiconductor substrate. As such, the present disclosure provides a ferromagnetic memory device that can be commercially manufactured by modifying currently known semiconductor processing flow.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor nanowire located on a substrate and including a channel region;
   an upper dielectric material portion located on a top surface of said channel region;
   a lower dielectric material portion located underneath a bottom surface of said channel region;
   a gate dielectric contacting said channel region, said upper dielectric material portion, and said lower dielectric material portion; and
   a ferromagnetic gate structure located on said gate dielectric,
   wherein said semiconductor nanowire further includes:
   a source region contacting a sidewall of said channel region; and
   a drain region contacting another sidewall of said channel region, and wherein said channel region has a doping of a first conductivity type at a first dopant concentration, said source region has a doping of a second conductivity type at a second dopant concentration that is greater than said first dopant concentration, and said drain region includes dopants at a third concentration that is greater than said first concentration, wherein said second conductivity type is the opposite of said first conductivity type.

2. The semiconductor structure of claim 1, wherein sidewalls of said channel region are vertically coincident with sidewalls of said upper dielectric material portion.

3. The semiconductor structure of claim 1, wherein sidewalls of said lower dielectric material portion are vertically coincident with said sidewalls of said channel region.

4. The semiconductor structure of claim 1, further comprising an insulator layer including a dielectric material and including a top surface in contact with an entirety of a bottom surface of said semiconductor nanowire, wherein said lower dielectric material portion is a portion of said insulator layer.

5. The semiconductor structure of claim 4, wherein said ferromagnetic gate structure extends below said top surface of said insulator layer.

6. The semiconductor structure of claim 1, further comprising:
   a raised source region located on said source region; and
   a raised drain region located on said drain region, wherein said raised source region and said raised drain region have a doped semiconductor material in epitaxial alignment with a semiconductor material in said semiconductor nanowire.

7. A semiconductor structure comprising:
a semiconductor nanowire located on a substrate and including a channel region;
an upper dielectric material portion located on a top surface of said channel region;
a lower dielectric material portion located underneath a bottom surface of said channel region;
a gate dielectric contacting said channel region, said upper dielectric material portion, and said lower dielectric material portion;
a ferromagnetic gate structure located on said gate dielectric;
a contact level dielectric material layer overlying said ferromagnetic gate structure;
a source contact via structure embedded in said contact level dielectric material layer and electrically shorted a source region in said semiconductor nanowire; and
a drain contact via structure embedded in said contact level dielectric material layer and electrically shorted a drain region in said semiconductor nanowire, wherein said ferromagnetic gate structure is electrically isolated from said semiconductor nanowire and any conductive structure embedded in said contact level dielectric material layer.

8. A method of operating a semiconductor device, said method comprising:
providing a semiconductor device including the semiconductor structure of claim 7;
magnetizing said ferromagnetic gate structure by passing electrical current along a lengthwise direction of said semiconductor nanowire; and
detecting a direction of magnetization in said ferromagnetic gate structure by measuring a magnitude of electrical current that passes through said semiconductor nanowire along said lengthwise direction under a predetermined measurement setting.

9. The semiconductor structure of claim 7, wherein said semiconductor nanowire further includes:
a source region contacting a sidewall of said channel region; and
a drain region contacting another sidewall of said channel region.

10. The semiconductor structure of claim 9, wherein said channel region has a doping of a first conductivity type at a first dopant concentration, said source region has a doping of a second conductivity type at a second dopant concentration that is greater than said first dopant concentration, and said drain region includes dopants at a third concentration that is greater than said first concentration, wherein said second conductivity type is the opposite of said first conductivity type.

11. A method of forming a semiconductor structure comprising:
forming a semiconductor nanowire on an insulator layer;
forming a disposable gate structure straddling said semiconductor nanowire;
forming a planarization dielectric layer over said semiconductor nanowire and around said disposable gate structure, wherein a top surface of said planarization dielectric layer is coplanar with a top surface of said disposable gate structure;
forming a gate cavity by removing at least said disposable gate structure selective to said planarization dielectric layer, wherein said gate dielectric is formed on sidewalls of said gate cavity;
forming a gate dielectric on surfaces of said gate semiconductor nanowire and in said gate cavity; and
forming a ferromagnetic gate structure on said gate dielectric, said ferromagnetic gate structure straddling said semiconductor nanowire and having a portion in said gate cavity.

12. The method of claim 11, further comprising extending said gate cavity into an upper portion of said insulator layer prior to formation of said gate dielectric.

13. The method of claim 11, further comprising forming a dielectric material portion over said semiconductor nanowire prior to formation of said disposable gate structure, wherein sidewalls of said dielectric material portion are vertically coincident with sidewalls of said semiconductor nanowire.

14. The method of claim 13, further comprising:
forming a source region in one end portion of said semiconductor nanowire; and
forming a drain region in another end portion of said semiconductor nanowire, wherein a portion between said source region and said drain region constitutes a channel region underlying said disposable gate structure.

15. A method of operating a semiconductor device, said method comprising:
providing a semiconductor device including the semiconductor structure of claim 1;
magnetizing said ferromagnetic gate structure by passing electrical current along a lengthwise direction of said semiconductor nanowire; and
detecting a direction of magnetization in said ferromagnetic gate structure by measuring a magnitude of electrical current that passes through said semiconductor nanowire along said lengthwise direction under a predetermined measurement setting.

16. The method of claim 15, further comprising applying a bias voltage to said ferromagnetic gate structure during measurement of said magnitude of said electrical current under said predetermined measurement setting.

17. The method of claim 15, wherein said semiconductor device is a transistor including said ferromagnetic gate structure as a gate electrode, and said measurement of said magnitude of electrical current is a measurement of electrical current between a source region and a drain region in said semiconductor nanowire in the presence of a bias voltage applied to said gate electrode.

18. The method of claim 15, wherein all surfaces of said ferromagnetic gate structure are in contact with dielectric surfaces.

19. The method of claim 15, wherein said semiconductor device includes a channel region including electrical dopants at a first concentration, and a source region and a drain region including electrical dopants at a second concentration that is greater than said first concentration, wherein said measurement of said magnitude of electrical current is a measurement of electrical resistance between said source region and said drain region while no bias voltage is applied to said ferromagnetic gate structure.

* * * * *